United States Patent
Ko et al.

(10) Patent No.: US 8,659,089 B2
(45) Date of Patent: Feb. 25, 2014

(54) NITROGEN PASSIVATION OF SOURCE AND DRAIN RECESSES

(75) Inventors: Jia-Yang Ko, Kaohsiung (TW); Ching-Chien Huang, Kaohsiung (TW); Ying-Han Chiou, Tainan (TW); Ling-Sung Wang, Tainan (TW)

(73) Assignee: Taiwan Semiconductor Manufacturing Company, Ltd., Hsin-Chu (CN)

( * ) Notice: Subject to any disclaimer, the term of this patent is extended or adjusted under 35 U.S.C. 154(b) by 20 days.

(21) Appl. No.: 13/267,648

(22) Filed: Oct. 6, 2011

(65) Prior Publication Data

US 2013/0087857 A1   Apr. 11, 2013

(51) Int. Cl.
*H01L 29/78* (2006.01)
*H01L 21/336* (2006.01)

(52) U.S. Cl.
USPC ............ 257/368; 257/E21.409; 257/E29.255; 438/285

(58) Field of Classification Search
USPC ........... 257/368, E21.409, 611, 655; 438/285
See application file for complete search history.

(56) References Cited

U.S. PATENT DOCUMENTS

| | | | |
|---|---|---|---|
| 7,927,989 B2 * | 4/2011 | Zhang et al. | 438/524 |
| 2003/0157771 A1 | 8/2003 | Luoh et al. | |
| 2007/0190731 A1 * | 8/2007 | Chen et al. | 438/299 |
| 2007/0207624 A1 * | 9/2007 | Chua | 438/758 |
| 2008/0194091 A1 | 8/2008 | Lin et al. | |
| 2009/0321809 A1 * | 12/2009 | Ramaswamy et al. | 257/321 |
| 2011/0027955 A1 | 2/2011 | Woon et al. | |

* cited by examiner

*Primary Examiner* — Long K Tran
*Assistant Examiner* — Jordan Klein
(74) *Attorney, Agent, or Firm* — Haynes and Boone, LLP

(57) ABSTRACT

An integrated circuit device and method for manufacturing the integrated circuit device is disclosed. In an example, the method includes providing a substrate; forming a gate structure over the substrate; removing portions of the substrate to form a first recess and a second recess in the substrate, such that the gate structure interposes the first recess and the second recess; forming a nitrogen passivation layer in the substrate, such that the first recess and the second recess are defined by nitrogen passivated surfaces of the substrate; and forming doped source and drain features over the nitrogen passivated surfaces of the first recess and the second recess, the doped source and drain features filling the first and second recesses.

20 Claims, 5 Drawing Sheets

PFET device region

NITROGEN PASSIVATION OF SOURCE AND DRAIN RECESSES

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as a metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often implements epitaxially grown silicon (Si) to form raised source and drain features for an n-type device, and epitaxially grown silicon germanium (SiGe) to form raised source and drain features for a p-type device. Various techniques directed at shapes, configurations, and materials of these source and drain features have been implemented to try and further improve transistor device performance. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
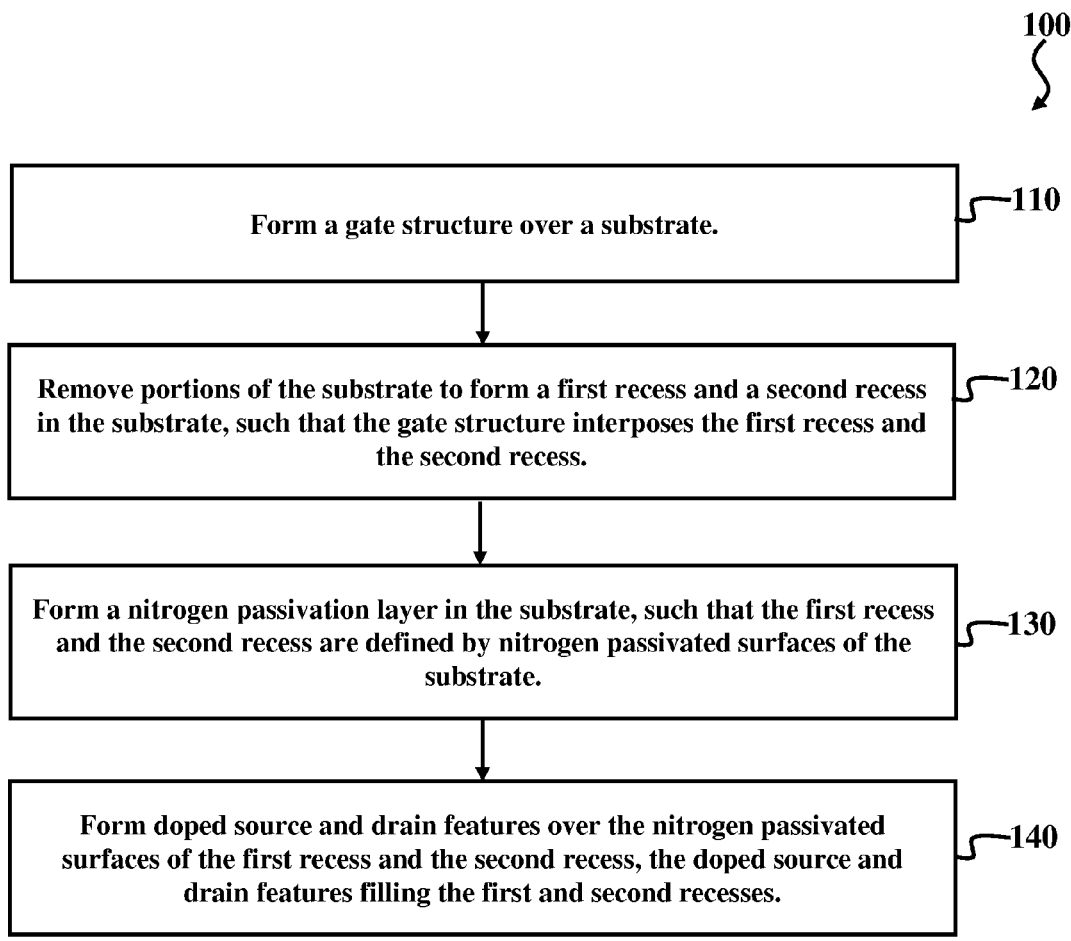
FIG. 1 is a flow chart of a method for fabricating an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of an embodiment of a method 100 for fabricating an integrated circuit device according to various aspects of the present disclosure. The method 100 begins at block 110 where a gate structure is formed over a substrate. At block 120, portions of the substrate are removed, by an etching process for example, to form a first recess and a second recess, such that the gate structure interposes the first recess and the second recess. At block 130, a nitrogen passivation layer is formed in the substrate, such that the first recess and the second recess are defined by nitrogen passivated surfaces of the substrate. In an example, the nitrogen passivation layer is formed by a decoupled plasma nitridation process. At block 140, doped source and drain features are formed over the nitrogen passivated surfaces of the first recess and the second recess, the doped source and drain features filling the first and second recesses. The nitrogen passivated surfaces can prevent dopants from the doped source and drain features from out-diffusing into the substrate. The method 100 may continue to complete fabrication of the integrated circuit device. Additional steps can be provided before, during, and after the method 100, and some of the steps described can be replaced or eliminated for additional embodiments of the method. The discussion that follows illustrates various embodiments of an integrated circuit device that can be fabricated according to the method 100 of FIG. 1.

FIGS. 2-5 are various diagrammatic cross-sectional views of an embodiment of an integrated circuit device 200 during various fabrication stages according to the method 100 of FIG. 1. FIGS. 2-5 have been simplified for the sake of clarity to better understand the inventive concepts of the present disclosure. In the depicted embodiment, as further discussed below, the integrated circuit device 200 includes a transistor device, specifically a p-channel metal-oxide-semiconductor field effect transistor (PFET). The integrated circuit device 200 may alternatively be an n-channel metal-oxide-semiconductor field effect transistor (NFET), in which case, the doping configurations and materials described herein should be read consistent with a an NFET (for example, read with doping configurations having an opposite conductivity and materials that provide a suitable channel for an NFET device). The integrated circuit device 200 can further include memory cells and/or logic circuits; passive components such as resistors, capacitors, inductors, and/or fuses; active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

Figure 2:
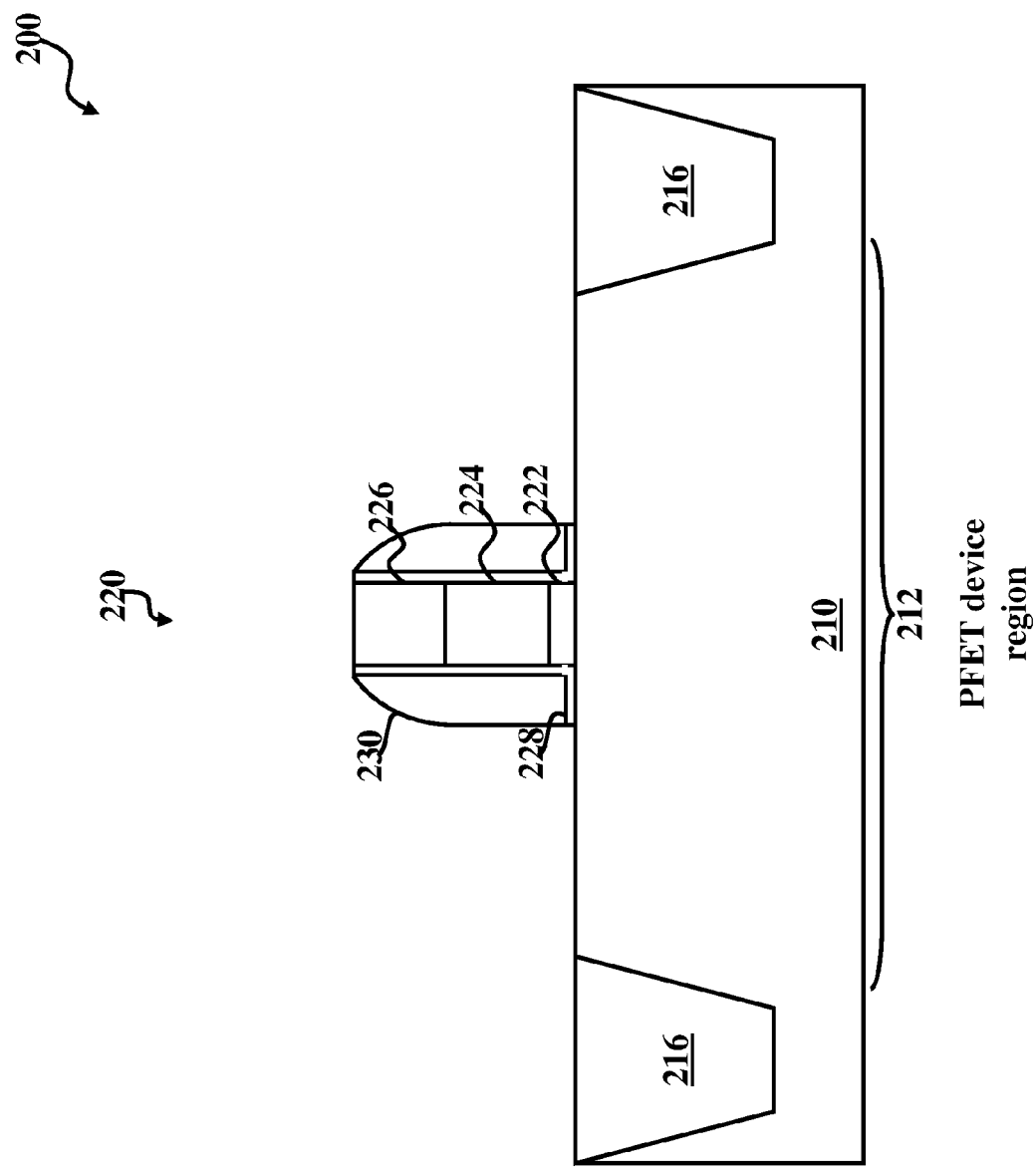
FIGS. 2-5 are various diagrammatic cross-sectional views of an embodiment of an integrated circuit device during various fabrication stages according to the method of FIG. 1.

In FIG. 2, a substrate 210 is provided. In the depicted embodiment, the substrate 210 is a semiconductor substrate including silicon. The substrate may be a p-type or n-type substrate. Alternatively or additionally, the substrate 210 includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, the substrate 210 may include a doped epi layer, a gradient semiconductor layer, and/or a semiconductor layer overlying another semiconductor layer of a different type, such as a silicon layer on a silicon germanium layer.

The substrate 210 may include various doped regions depending on design requirements of the integrated circuit device 200 (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure. The integrated circuit device 200 includes a device region 212 configured for a particular device. In the depicted embodiment, the device region 212 is configured for a PFET device. The device region 212 may thus include a doped region configured for a PFET device. The device region 212 may be referred to as a PFET device region.

Isolation feature 216 is formed in the substrate 210 to isolate various regions of the substrate 210. For example, the isolation feature 216 isolates the device region 212 from other device regions (such as device regions configured for a NFET device) and from other devices (not shown). The isolation feature 216 utilizes isolation technology, such as local oxidation of silicon (LOCOS) and/or shallow trench isolation (STI), to define and electrically isolate the various regions. The isolation feature 216 includes silicon oxide, silicon nitride, silicon oxynitride, other suitable materials, or combinations thereof. The isolation feature 216 is formed by any suitable process. As one example, forming an STI includes a photolithography process, etching a trench in the substrate (for example, by using a dry etching, wet etching, or combinations thereof), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer over the pad oxide, patterning an STI opening in the pad oxide and nitride layer using photoresist and masking, etching a trench in the substrate in the STI opening, optionally growing a thermal oxide trench liner to improve the trench interface, filling the trench with oxide, using chemical mechanical polishing (CMP) processing to etch back and planarize, and using a nitride stripping process to remove the nitride layer.

A gate structure 220 is disposed over the substrate 210 in the PFET device region 212. In the depicted embodiment, the gate structure 220 includes a gate dielectric layer 222, a gate layer 224 (referred to as a gate electrode), and a hard mask layer 226. The gate dielectric layer 222, gate layer 224, and hard mask layer 226 form a gate stack of the gate structure 220. The gate stack 220 may include additional layers depending on design requirements of the PFET device. The gate structure 220 (for example, the various layers of the gate stack) is formed by deposition processes, lithography patterning processes, etching processes, or a combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable deposition methods, or combinations thereof. The lithography patterning processes include resist coating (such as spin-on coating), soft baking, mask aligning, exposure, post-exposure baking, developing the resist, rinsing, drying (such as hard baking), other suitable processes, or combinations thereof. Alternatively, the lithography exposing process is implemented or replaced by other proper methods, such as maskless photolithography, electron-beam writing, or ion-beam writing. The etching processes include dry etching, wet etching, other etching methods, or combinations thereof.

The gate dielectric layer 222 is formed over the substrate 210 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HMO, HMO, HfZrO, $Ta_2O_5$, $TiO_2$, $Al_2O_3$, $ZrO_2$, $Y_2O_3$, $L_2O_3$, other suitable materials, or combinations thereof. The gate dielectric layer 222 may include a multi-layer structure. For example, the gate dielectric layer 222 may include an interfacial layer, and a high-k dielectric material layer formed on the interfacial layer. An exemplary interfacial layer may be a grown silicon oxide layer formed by a thermal process or ALD process.

The gate layer 224 is formed over the gate dielectric layer 222. In the depicted embodiment, the gate layer 224 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate layer 224 includes a conductive layer having a proper work function, therefore, the gate layer 224 can also be referred to as a work function layer. The work function layer includes any suitable material, such that the layer can be tuned to have a proper work function for enhanced performance of the associated device. For example, if a p-type work function metal (p-metal) for a PFET device is desired, as in the depicted embodiment, the conductive layer may include TiN or TaN. On the other hand, if an n-type work function metal (n-metal) for an NFET device is desired, the conductive layer may include Ta, TiAl, TiAlN, or TaCN. The work function layer may include doped conducting oxide materials. The gate layer 224 may include other conductive materials, such as aluminum, copper, tungsten, metal alloys, metal silicide, other suitable materials, or combinations thereof. For example, where the gate layer 224 includes a work function layer, another conductive layer can be formed over the work function layer.

The hard mask layer 226 is formed over the gate layer 224. The hard mask layer 226 includes silicon oxide, silicon nitride, silicon oxynitride, silicon carbide, other suitable dielectric material, or combinations thereof. The hard mask layer 226 may have a multi-layer structure.

Spacer liner 228 and spacers 230 may be formed for the gate structure 220. In the depicted embodiment, the spacer liner 228 includes an oxide material, such as silicon oxide, and the spacers 230 include a nitride material, such as silicon nitride. Alternatively, the spacers 230 include another suitable dielectric material, such as silicon oxide, silicon oxynitride, or combinations thereof. The spacer liner 228 may also include another suitable dielectric material. The spacer liner 228 and spacers 230 are formed by a suitable process. For example, the spacer liner 228 and spacers 230 are formed by blanket depositing a first dielectric layer (a silicon oxide layer) over the integrated circuit device 200 and a second dielectric layer (a silicon nitride layer) over the first dielectric layer, and then, anisotropically etching to remove the dielectric layers to form the spacer liner 228 and spacers 230 as illustrated in FIG. 2. The spacer liner 228 and spacers 230 are positioned adjacent the sidewalls of the gate stack (gate dielectric layer 222, gate layer 224, and hard mask layer 226) of the gate structure 220. In the depicted embodiment, the spacers 230 are offset (also referred to as dummy) spacers, which will be removed during subsequent processing. Alternatively, the spacers 230 may be main spacers and form a portion of the gate structure of the PFET device.

Figure 3:
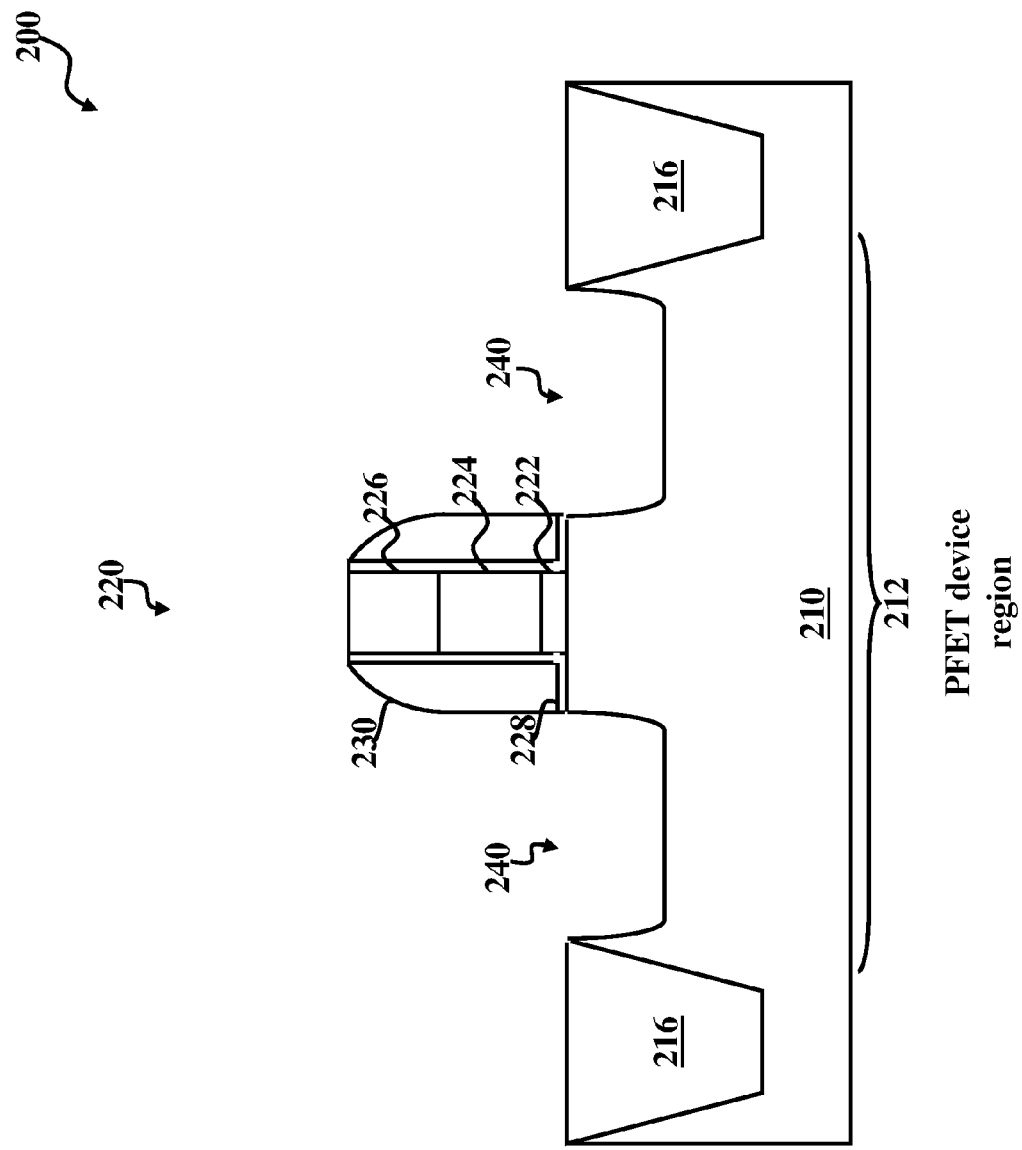

In FIG. 3, recesses 240 are formed in a source region and a drain region of the PFET device in the PFET device region 212. In the depicted embodiment, the gate structure 220 interposes the source region and the drain region of the PFET device, and a channel region is defined between the source region and the drain region. The recesses 240 extend a depth into the substrate 210. In an example, the recesses 240 extend a depth of about 60 nm to about 65 nm into the substrate 210. In the depicted embodiment, an etching process removes portions of the substrate 210 to form recesses 240 in the substrate 210. The etching process includes a dry etching process, wet etching process, or combination thereof. The dry and wet etching processes have etching parameters that can be tuned to achieve a desired profile for the recesses 240, such as etchants used, etching temperature, etching solution concentration, etching pressure, source power, RF bias voltage, RF bias power, etchant flow rate, and other suitable parameters. In an example, the dry etching process is a plasma etching process that uses a fluorine-containing etchant, a chlorine-containing etching, a bromine-containing ethcant, or other suitable etchant. In an example, the wet etching process uses a wet etching solution that includes $NH_4OH$, HF (hydrofluoric acid), TMAH (tetramethylammonium hydroxide), other suitable wet etching solution, or combinations thereof. After the etching process, a pre-cleaning process may be performed to clean the recesses 240 with a HF solution or other suitable solution.

Figure 4:
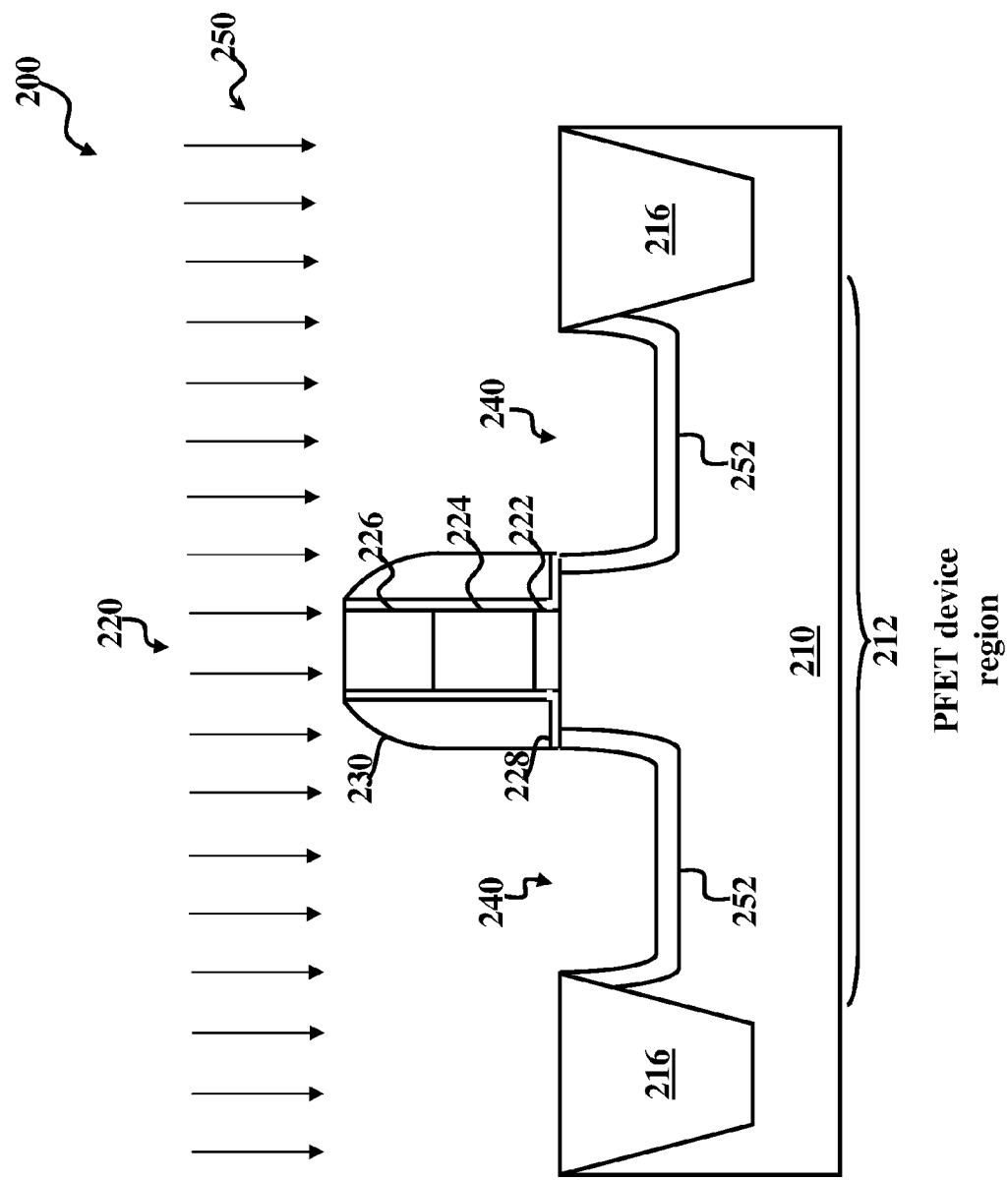

In FIG. 4, a decoupled plasma nitridation process 250 is performed to form a passivation layer 252 along surfaces of the substrate 210 that define the recesses 240. The decoupled plasma nitridation process 250 uses inductive coupling to generate nitrogen-containing plasma and introduce nitrogen into the substrate 210, particularly along the surfaces of substrate 210 that define the recesses 240, to form the passivation layer 252. The recesses 240 are thus defined by nitrogen passivated surfaces of the substrate 210. Various parameters of the decoupled plasma nitridation process 250, such as nitrogen-containing gas, gas flow rate, temperature, time, source power, bias voltage, pulse radio frequency, and other suitable parameters, can be tuned to achieve a desired nitrogen dosage and a desired nitrogen dopant profile of the passivation layer 252. In an example, the decoupled plasma nitridation process 250 exposes the substrate 210 to a nitrogen-containing gas, such as $N_2$, at a flow rate of about 280 sccm to about 320 sccm for about 90 seconds to about 100 seconds at about room temperature (for example, about 20° C. to about 25° C.). In an example, the substrate 210 is exposed to the nitrogen-containing gas for about 30 seconds. In an example, the flow rate of the nitrogen-containing gas is about 300 sccm.

As described further below, the passivation layer 252 (and thus the nitrogen passivated surfaces of the substrate 210 defining the recesses 240) provides a barrier around the recesses 240 that prevents out-diffusion of dopants, such as boron dopants, that may be used during subsequent doping processes. The passivation layer 252 extends a depth into the substrate 210 from the surfaces of the substrate 210 that define the recesses 240. In the depicted embodiment, the depth is less than or equal to about 1,000 Å. The passivation layer 252 further has a nitrogen dosage and a nitrogen doping profile. In an example, the passivation layer 252 includes a nitrogen doping concentration of about $1\times10^{17}$ atoms/cm$^3$ to about $1\times10^{20}$ atoms/cm$^3$. Other nitrogen doping concentrations may be used to optimize a ratio of the nitrogen to silicon in the passivation layer 252. In the depicted embodiment, the nitrogen doping concentration is uniform throughout the passivation layer 252, and thus, a nitrogen dopant profile of the passivation layer 252 is uniform when observed from the surfaces of the substrate 210 that define the recesses 240 to the depth in the substrate 210. Alternatively, the nitrogen dopant profile may be gradient, where a concentration of nitrogen increases as the depth into the substrate 210 increases from the surfaces of the substrate 210 that define the recesses 240.

The decoupled plasma nitridation process 250 replaces a carbon implantation process typically used to form a carbon implant along the surfaces of the substrate 210 that define the recesses 240. Though the carbon implant formed by the carbon implantation process effectively prevents out-diffusion of dopants, an annealing process is required to activate the carbon implant. Such annealing undesirably increases a thermal budget required for manufacturing the integrated circuit device 200. By replacing the carbon implantation process with the decoupled plasma nitridation process 250, as described herein, a barrier for preventing out-diffusion of dopants during subsequent processing is achieved without having to perform an additional annealing process. Thermal budget issues that arise using the carbon implantation process are thus eliminated. By implementing the decoupled plasma nitridation process 250, manufacturing time may also be decreased, since the annealing step can be eliminated.

Figure 5:
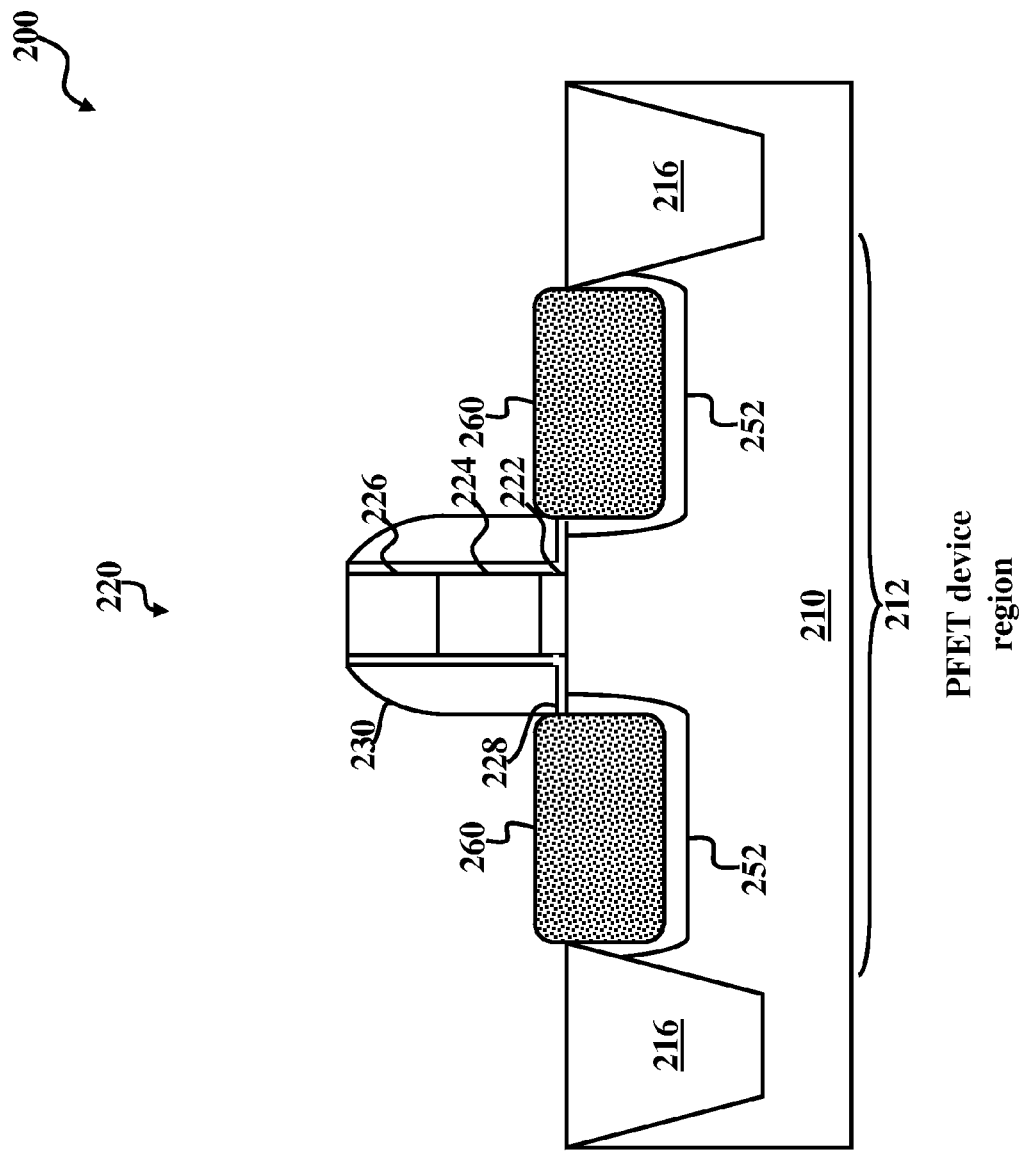

In FIG. 5, a semiconductor material is formed in the recesses 240 to form a strained structure in the PMOS device region 212. The semiconductor material forms source and drain features 260 in the recesses 240. The source and drain features 260 may alternatively be referred to as raised source and drain regions. In the depicted embodiment, an epitaxy or epitaxial (epi) process is performed to deposit the semiconductor material in the recesses 240. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof. The epi process may use gaseous and/or liquid precursors, which may interact with the composition of the substrate 210. The deposited semiconductor material provides stress or strain to the channel region of the PFET device to enhance carrier mobility of the device and enhance device performance. In the depicted embodiment, silicon germanium (SiGe) is deposited by an epi process in the recesses 240 of the substrate 210 to form SiGe source and drain features 260. Further, in the depicted embodiment, the source and drain features 260 are doped with a suitable dopant. For example, the SiGe source and drain features are doped with boron (B) to form SiGe:B source and drain features. The source and drain features 260 may be doped with other suitable dopants, such as carbon (C) or antimony (Sb). Alternatively, the source and drain features 260 are silicon (Si) source and drain features doped with antimony (Si:Sb source and drain features). In yet another alternative, the source and drain features 260 are silicon (Si) source and drain features doped with carbon (C) (Si:C source and drain features). The source and drain features 260 may be in-situ doped or undoped during the epi process, and then doped in a subsequent process. The doping may be achieved by an ion implantation process, plasma immersion ion implantation (PIII) process, gas and/or solid source diffusion process, other suitable process, or combinations thereof. The source and drain features 260 may further be exposed to annealing processes, such as a rapid thermal annealing process.

As noted above, the passivation layer 252, which is disposed between the source and drain features 260 and the substrate 210, provides a barrier around the recesses 240 that prevents out-diffusion of dopants, such as boron dopants. Accordingly, during the doping of the source and drain features 260, the passivation layer 252 prevents the dopant, such as boron, from out-diffusing into the substrate 210, and particularly from out-diffusing into a channel region of the integrated circuit device 200 (note that the channel region is defined between the source and drain regions in the PFET device region 212, particularly underneath the gate structure 220 and between the source and drain features 260). The passivation layer 252 includes a nitrogen to silicon ratio that is optimized to prevent out-diffusion of dopants while providing a suitable substrate surface for forming the epitaxially grown source and drain features 260. Optimizing the nitrogen to silicon ratio may depend on how well the process for forming the source and drain features 260 is controlled.

The integrated circuit device 200 can continue with processing to complete fabrication as discussed briefly below. For example, spacers may be formed for the gate structure 220. In an example, the spacers 230 (which served as offset or dummy spacers in the depicted embodiment) are removed after forming the source and drain features 260, and spacers for the gate structure 220 may be subsequently formed. Lightly doped source/drain (LDD) regions and/or heavily doped source/drain (HDD) regions may be formed by ion implantation of n-type dopants, such as phosphorous or arsenic, or p-type dopants, such as boron. The LDD and/or HDD regions may be formed earlier than in the depicted embodiment. Additionally, silicide features are formed on the raised source/drain features, for example, to reduce contact resistance. The silicide features may be formed on the source and drain features by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. A contact etch stop layer (CESL) may be formed on top of the gate structure 220 before forming the ILD layer. In an example, the gate layer 224 remains polysilicon in the final device. In another example, the polysilicon is removed and replaced with a metal in a gate last or gate replacement process. In a gate last process, the CMP process on the ILD layer is continued to expose the hard mask layer of the gate structure, and an etching process is performed to remove the hard mask layer and the polysilicon, thereby forming trenches. The trenches are then filled with a proper work function metal (e.g., p-type work function metal or n-type work function metal). Further, a multilayer interconnection (MLI) including metal layers and inter-metal dielectric (IMD) is formed over the substrate 210 to electrically connect various features or structures of the integrated circuit device 200. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

The integrated circuit device 200 serves as an example. The integrated circuit device 200 may be used in various applications such as digital circuitry, imaging sensor devices, a hetero-semiconductor device, dynamic random access memory (DRAM) cell, a single electron transistor (SET), and/or other microelectronic devices (collectively referred to herein as microelectronic devices). Further, aspects of the present disclosure are also applicable and/or readily adaptable to other types of transistors, including single-gate transistors, double-gate transistors, and other multiple-gate transistors, and may be employed in many different applications, including sensor cells, memory cells, logic cells, and others.

The present disclosure provides for many different embodiments. Different embodiments may have different advantages, and no particular advantage is necessarily required of any embodiment. In an example, a method includes providing a substrate; forming a gate structure over the substrate; removing portions of the substrate to form a first recess and a second recess in the substrate, such that the gate structure interposes the first recess and the second recess; forming a nitrogen passivation layer in the substrate, such that the first recess and the second recess are defined by nitrogen passivated surfaces of the substrate; and forming doped source and drain features over the nitrogen passivated surfaces of the first recess and the second recess, the doped source and drain features filling the first and second recesses. Forming the nitrogen passivation layer may include performing a decoupled plasma nitridation process, which may include implanting nitrogen in the substrate to a depth of less than or equal to about 1,000 Å. Forming the nitrogen passivation layer may include implanting a nitrogen dopant in the substrate without performing an annealing process.

In an example, the substrate is a silicon substrate, and forming the nitrogen passivation layer includes optimizing a silicon to nitrogen ratio of the nitrogen passivation layer, such that the nitrogen passivation layer prevents out-diffusion of a dopant when forming the doped source and drain features. Forming the doped source and drain features over the nitrogen passivated surfaces may include epitaxially growing a semiconductor material over the nitrogen passivated surfaces, and doping the semiconductor material. The epitaxailly grown semiconductor material may be silicon germanium, and the silicon germanium may be doped with boron. Doping the semiconductor material may be performed while epitaxially growing the semiconductor material or after epitaxially growing the semiconductor material.

In another example, a method includes forming a gate structure over a substrate; forming a recess in the substrate adjacent the gate structure, wherein the recess is defined by a surface of the substrate; performing a decoupled plasma nitridation process, thereby forming a passivation layer along the surface of the substrate that defines the recess; and after forming the passivation layer, forming a doped, epitaxial semiconductor feature in the recess. The decoupled plasma nitridation process may use a nitrogen-containing gas that includes $N_2$. The decoupled plasma nitridation process may be performed at room temperature, such as a temperature of about 20° C. to about 25° C. The doped, epitaxial semiconductor feature may include an epitaxial silicon germanium feature doped with boron. Forming the passivation layer may include optimizing a nitrogen concentration of the passivation layers, such that the passivation layer prevents boron diffusing into the substrate during the forming the epitaxial silicon germanium feature doped with boron.

In yet another example, a method includes forming a gate structure over a substrate; etching a source recess and a drain recess in the substrate, such that the gate structure interposes the source recess and the drain recess; forming a nitrogen barrier layer along surfaces of the substrate that define the source and drain recesses without performing an annealing process; and forming a doped source and drain feature in the source recess and the drain recess, the doped source and drain feature being disposed on the nitrogen barrier layer. Forming the nitrogen barrier layer along the surfaces of the substrate that define the source and drain recesses without performing an annealing process may include performing a decoupled plasma nitridation process. The nitrogen barrier layer may have a substantially uniform nitrogen doping concentration throughout. Forming the doped source and drain feature may include epitaxially growing silicon germanium in the source and drain recesses; and doping the silicon germanium with boron. The silicon germanium may be doped with boron while the silicon germanium is epitaxially grown or after the silicon germanium is epitaxially grown.

In yet another example, an integrated circuit device includes a substrate and a gate structure disposed over the substrate, wherein the gate structure interposes a source region and a drain region of the substrate. The source region and the drain region include a nitrogen passivation layer disposed in the substrate, and a doped, epitaxial semiconductor feature disposed on the nitrogen passivation layer. In an example, the doped, epitaxial semiconductor feature includes silicon germanium doped with boron.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate;
forming a gate structure over the substrate;
forming a spacer liner on sidewalls of the gate structure, wherein the spacer liner is formed of a first material;
forming a spacer over the spacer liner on the sidewalls of the gate structure, wherein the spacer is formed of a second material that is different than the first material;
after forming the spacer over the spacer liner on the sidewalls of the gate structure, removing portions of the substrate to form a first recess and a second recess in the substrate, such that the gate structure interposes the first recess and the second recess;
forming a nitrogen passivation layer in the substrate, such that the first recess and the second recess are defined by nitrogen passivated surfaces of the substrate, wherein the nitrogen passivation layer has a gradient nitrogen dopant profile such that nitrogen concentration increases from a top surface of the nitrogen passivation layer to an opposing bottom surface of the nitrogen passivation layer; and
forming doped source and drain features over the nitrogen passivated surfaces of the first recess and the second recess, the doped source and drain features filling the first and second recesses.

2. The method of claim 1 wherein the forming the nitrogen passivation layer in the semiconductor substrate includes performing the decoupled plasma nitridation process, wherein performing the decoupled plasma nitridation process includes implanting nitrogen in the substrate to a depth of less than or equal to about 1,000 Å.

3. The method of claim 1 wherein the forming the doped source and drain features over the nitrogen passivated surfaces includes:
epitaxially growing a semiconductor material over the nitrogen passivated surfaces; and
doping the semiconductor material.

4. The method of claim 3 wherein the epitaxially growing the semiconductor material over the nitrogen passivated surfaces includes epitaxially growing silicon germanium.

5. The method of claim 4 wherein the doping the semiconductor material includes doping the silicon germanium with boron.

6. The method of claim 3 wherein the doping the semiconductor material includes one of doping the semiconductor material while epitaxially growing the semiconductor material or doping the semiconductor material after epitaxially growing the semiconductor material.

7. The method of claim 1, wherein the first recess has an edge that is substantially coplanar with an outer edge of the spacer.

8. The method of claim 1, wherein the first material includes an oxide material and the second material includes a nitride material.

9. A method comprising:
forming a gate structure over a substrate;
forming a shallow trench isolation feature in the substrate;
forming a recess in the substrate adjacent the gate structure, wherein the recess is defined by a surface of the substrate, wherein the recess extends from the shallow trench isolation feature to an outer edge of a sidewall spacer formed on a sidewall of the gate structure;
performing a decoupled plasma nitridation process, thereby forming a passivation layer along the surface of the substrate that defines the recess, wherein the passivation layer has a gradient nitrogen dopant profile such that a concentration of nitrogen adjacent a top surface of the passivation layer is less than a concentration of nitrogen adjacent an opposing bottom surface of the passivation layer; and
after forming the passivation layer, forming a doped, epitaxial semiconductor feature in the recess.

10. The method of claim 9 wherein the performing the decoupled plasma nitridation process includes performing the decoupled plasma nitridation process at a temperature of about 20° C. to about 25° C.

11. The method of claim 9 wherein the forming the doped, epitaxial semiconductor feature in the recess includes forming an epitaxial silicon germanium feature doped with boron.

12. The method of claim 11 wherein the forming the passivation layer includes optimizing a nitrogen concentration of the passivation layers, such that the passivation layer prevents boron diffusing into the substrate during the forming the epitaxial silicon germanium feature doped with boron.

13. The method of claim 9, forming the sidewall spacer prior to forming the recess in the substrate adjacent the gate structure, and
wherein the recess extends within the substrate towards the gate structure to only the outer edge of the sidewall spacer formed on the sidewall of the gate structure.

14. A method comprising:
forming a gate structure over a substrate;
forming an L-shaped spacer liner on a sidewall of the gate structure;
after forming the L-shaped spacer liner on the sidewall of the gate structure, forming a spacer on the L-shaped spacer liner on the sidewall of the gate structure, after forming the spacer on the L-shaped spacer liner on the sidewall of the gate structure, etching a source recess and a drain recess in the substrate, such that the gate structure interposes the source recess and the drain recess;

forming a nitrogen barrier layer along surfaces of the substrate that define the source and drain recesses without performing an annealing process, wherein the nitrogen barrier layer has a gradient nitrogen dopant profile such that nitrogen concentration increases from a top surface of the nitrogen barrier layer to an opposing bottom surface of the nitrogen barrier layer; and forming a doped source and drain feature in the source recess and the drain recess, the doped source and drain feature being disposed on the nitrogen barrier layer.

15. The method of claim 14 wherein the forming the nitrogen barrier layer along the surfaces of the substrate that define the source and drain recesses without performing an annealing process includes performing a decoupled plasma nitridation process.

16. The method of claim 14 wherein the forming the nitrogen barrier layer along the surfaces of the substrate that define the source and drain recesses includes forming a substantially uniform nitrogen doping concentration throughout the nitrogen barrier layer.

17. The method of claim 14 wherein the forming the doped source and drain feature in the source recess and the drain recess includes:

epitaxially growing silicon germanium in the source and drain recesses; and doping the silicon germanium with boron.

18. The method of claim 14, wherein the L-shaped spacer liner includes an oxide material and the spacer includes a nitride material.

19. An integrated circuit device comprising:

a substrate; and a gate structure disposed over the substrate, wherein the gate structure interposes a source region and a drain region of the substrate, wherein the source region and the drain region each include:

a nitrogen passivation layer disposed in the substrate, wherein the nitrogen passivation layer has a gradient nitrogen dopant profile such that a concentration of nitrogen adjacent a top surface of the nitrogen passivation layer is less than a concentration of nitrogen adjacent an opposing bottom surface of the nitrogen passivation layer, and a doped, epitaxial semiconductor feature disposed on the nitrogen passivation layer; and an L-shaped spacer liner disposed on a sidewall of the gate structure, wherein the L-shaped spacer liner has an end surface facing away from the sidewall of the gate structure;

a spacer disposed on the L-shaped spacer liner on the sidewall of the gate structure, wherein the spacer has an end surface facing away from the sidewall of the gate structure, wherein an edge of the nitrogen passivation layer is substantially coplanar with the end surface of the L-shaped spacer and the end surface of the spacer.

20. The integrated circuit device of claim 19 wherein the doped, epitaxial semiconductor feature includes silicon germanium doped with boron.

* * * * *